United States Patent
Park et al.

(10) Patent No.: US 7,425,735 B2
(45) Date of Patent: Sep. 16, 2008

(54) MULTI-LAYER PHASE-CHANGEABLE MEMORY DEVICES

(75) Inventors: Jeong-Hee Park, Gyeonggi-do (KR); Ju-Chul Park, Gyeonggi-do (KR); Jun-Soo Bae, Gyeonggi-do (KR); Bong-Jin Kuh, Gyeonggi-do (KR); Yong-Ho Ha, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/627,775

(22) Filed: Jan. 26, 2007

(65) Prior Publication Data

US 2007/0215853 A1    Sep. 20, 2007

Related U.S. Application Data

(63) Continuation-in-part of application No. 10/910,945, filed on Aug. 4, 2004, which is a continuation-in-part of application No. 10/781,597, filed on Feb. 18, 2004, now Pat. No. 7,115,927.

(30) Foreign Application Priority Data

| Feb. 24, 2003 | (KR) | 10-2003-11416 |
| Feb. 24, 2004 | (KR) | 10-2004-12358 |
| Jan. 27, 2006 | (KR) | 10-2006-0008674 |

(51) Int. Cl.
  H01L 27/148 (2006.01)
  H01L 29/768 (2006.01)
  H01L 27/10 (2006.01)
  H01L 29/73 (2006.01)
  H01L 29/74 (2006.01)
  H01L 23/48 (2006.01)
  H01L 23/52 (2006.01)
  H01L 29/40 (2006.01)

(52) U.S. Cl. ............... 257/246; 257/207; 257/208; 257/211; 257/242; 257/247; 257/248; 257/758; 257/759; 257/760

(58) Field of Classification Search ............... 257/242, 257/246–248, 207–208, 211, 758–760
See application file for complete search history.

(56) References Cited

U.S. PATENT DOCUMENTS 4,599,705 A    7/1986    Holmberg et al.

(Continued)

FOREIGN PATENT DOCUMENTS

JP    10340489 A    12/1998

(Continued)

OTHER PUBLICATIONS

Notice to File Response/Amendment to the Examination Report, Korean App. No. 10-2004-0012358, Dec. 21, 2005.

(Continued)

*Primary Examiner*—Ida M. Soward
(74) *Attorney, Agent, or Firm*—Myers Bigel Sibley & Sajovec, PA

(57) ABSTRACT

A phase-changeable memory device includes a phase-changeable material pattern and first and second electrodes electrically connected to the phase-changeable material pattern. The first and second electrodes are configured to provide an electrical signal to the phase-changeable material pattern. The phase-changeable material pattern includes a first phase-changeable material layer and a second phase-changeable material layer. The first and second phase-changeable material patterns have different chemical, physical, and/or electrical characteristics. For example, the second phase-changeable material layer may have a greater resistivity than the first phase-changeable material layer. For instance, the first phase-changeable material layer may include nitrogen at a first concentration, and the second phase-changeable material layer may include nitrogen at a second concentration that is greater than the first concentration. Related devices and fabrication methods are also discussed.

24 Claims, 5 Drawing Sheets

U.S. PATENT DOCUMENTS

| | | | |
|---|---|---|---|
| 4,653,024 A | 3/1987 | Young et al. | |
| 4,820,394 A | 4/1989 | Young et al. | |
| 4,845,533 A | 7/1989 | Pryor et al. | |
| 4,924,436 A | 5/1990 | Strand | |
| 5,124,232 A | 6/1992 | Nakanishi et al. | |
| 5,166,758 A | 11/1992 | Ovshinsky et al. | |
| 5,278,011 A | 1/1994 | Yamada et al. | |
| 5,714,768 A | 2/1998 | Ovshinsky et al. | |
| 5,811,816 A | 9/1998 | Gallagher et al. | |
| 5,825,046 A | 10/1998 | Czubatyj et al. | |
| 6,258,062 B1 | 7/2001 | Thielen et al. | |
| 6,365,256 B1 * | 4/2002 | Tyan et al. | 428/64.1 |
| 6,381,967 B1 | 5/2002 | Craig | |
| 6,429,064 B1 | 8/2002 | Wicker | |
| 6,437,383 B1 | 8/2002 | Xu | |
| 6,507,061 B1 | 1/2003 | Hudgens et al. | |
| 6,511,862 B2 * | 1/2003 | Hudgens et al. | 438/95 |
| 6,670,628 B2 * | 12/2003 | Lee et al. | 257/4 |
| 6,690,026 B2 * | 2/2004 | Peterson | 257/4 |
| 6,759,267 B2 | 7/2004 | Chen | |
| 6,774,388 B2 | 8/2004 | Hudgens et al. | |
| 6,791,102 B2 * | 9/2004 | Johnson et al. | 257/3 |
| 6,856,002 B2 | 2/2005 | Moore et al. | |
| 6,858,277 B1 | 2/2005 | Yamada et al. | |
| 6,867,425 B2 * | 3/2005 | Wicker | 257/3 |
| 6,919,578 B2 | 7/2005 | Lowrey et al. | |
| 7,037,762 B2 | 5/2006 | Joo et al. | |
| 2002/0038872 A1 * | 4/2002 | Lowrey et al. | 257/178 |
| 2002/0072010 A1 | 6/2002 | Kubogata | |
| 2002/0081804 A1 | 6/2002 | Gill et al. | |
| 2003/0080427 A1 * | 5/2003 | Hudgens et al. | 257/748 |
| 2003/0151041 A1 | 8/2003 | Chiang | |
| 2004/0012009 A1 | 1/2004 | Casagrande et al. | |
| 2004/0106065 A1 | 6/2004 | Miyamoto et al. | |
| 2004/0115945 A1 | 6/2004 | Lowrey et al. | |
| 2004/0191683 A1 | 9/2004 | Nishihara et al. | |
| 2004/0192006 A1 | 9/2004 | Campbell et al. | |
| 2005/0030800 A1 | 2/2005 | Johnson et al. | |
| 2005/0115829 A1 | 6/2005 | Yahagi et al. | |
| 2005/0227035 A1 | 10/2005 | Fuchioka et al. | |

FOREIGN PATENT DOCUMENTS

| | | |
|---|---|---|
| JP | 2002-203392 | 7/2002 |
| KR | 1020040078464 A | 9/2004 |
| KR | 1020014011708 A | 2/2005 |
| WO | WO 00/54982 A1 | 9/2000 |

OTHER PUBLICATIONS

Notice to File a Response/Amendment to the Examination Report corresponding to Korean Patent Application No. 10-2004-0012358 mailed May 24, 2006.

* cited by examiner

MULTI-LAYER PHASE-CHANGEABLE MEMORY DEVICES

CROSS-REFERENCE TO RELATED APPLICATIONS

This application is a continuation-in-part of and claims priority from U.S. patent application Ser. No. 10/910,945, filed Aug. 4, 2004, which claims priority from Korean Patent Application No. 2004-12358, filed on Feb. 24, 2004. U.S. patent application Ser. No. 10/910,945 is a continuation-in-part of and claims priority from U.S. patent application Ser. No. 10/781,597, filed Feb. 18, 2004, now U.S. Pat. No. 7,115,927 which claims priority from Korean Patent Application No. 2003-11416, filed on Feb. 24, 2003. The present application also claims priority under 35 U.S.C. § 119 from Korean Patent Application No. 2006-0008674, filed on Jan. 27, 2006 in Korean Intellectual Property Office. The present application thus claims the benefit of priority from all of the above-referenced U.S. and Korean applications, and the disclosures of all of the above-referenced U.S. and Korean applications are hereby incorporated by reference herein in their entireties.

FIELD OF THE INVENTION

The present invention relates to non-volatile memory devices, and more particularly, to phase-changeable memory devices and methods for fabricating the same.

BACKGROUND OF THE INVENTION

A phase-changeable memory device is a kind of non-volatile memory device. Phase-changeable memory devices may use a phase-changeable material such as a chalcogenide compound that can be switched between a crystalline state and an amorphous state based on applied electrical signals, thereby exhibiting a high-resistance state and a low-resistance state that can be distinguished from each other. In response to applied voltages, current flow through the phase-changeable material may heat the phase-changeable material. Depending on the heating temperature and duration, the phase-changeable material may be changed to a program state of a high-resistance (i.e., a reset state) or a low-resistance (i.e., a set state). The high-resistance state and the low-resistance state may be switched and/or reversed based on the applied current.

The heating temperature of the phase-changeable material may be proportional to the amount of applied current. In order to achieve a relatively high density of integration, it may be desirable to reduce the temperature by reducing a program current flow. More particularly, it may be desirable to reduce the switching current for the reset state, as switching to the reset state may require more current than switching to the set state.

SUMMARY OF THE INVENTION

According to some embodiments of the present invention, a phase-changeable memory device includes a phase-changeable material pattern, and first and second electrodes electrically connected to the phase-changeable material pattern that provide an electrical signal to the phase-changeable material pattern. The phase-changeable material pattern includes a first phase-changeable material layer and a second phase-changeable material layer on the first phase changeable material layer. The first and second phase-changeable material layers have different chemical, physical, and/or electrical characteristics. For example, the second phase-changeable material layer may have a greater resistivity than the first phase-changeable material layer.

According to other embodiments of the present invention, a phase-changeable memory device includes a phase-changeable material pattern, and first and second electrodes electrically connected to the phase-changeable material pattern. The first and second electrodes are configured to provide an electrical signal to the phase-changeable material pattern. The phase-changeable material pattern includes a first phase-changeable material layer including nitrogen at a first concentration, and a second phase-changeable material layer including nitrogen at a second concentration that is greater than the first concentration.

In some embodiments, the first concentration of nitrogen may be from about 0 to about 5 atomic percent of the first phase-changeable material layer. In addition, the second concentration of nitrogen may be from about 5 to about 20 atomic percent of the second phase-changeable material layer.

In other embodiments, the first and second concentrations of nitrogen may be selected such that a phase change is induced in the first phase-changeable material layer but not in the second phase-changeable material layer when a predetermined current is applied to the phase-changeable material pattern via the first and second electrodes.

In some embodiments, the second phase-changeable material layer may further include a conductive material. For example, the second electrode may be on the second phase-changeable material layer, and an adhesive layer including the conductive material may be between the second electrode and the second phase-changeable material layer. The first phase-changeable material layer may be directly on the second phase-changeable material layer opposite the adhesive layer, and the second phase-changeable material layer may be configured to substantially prevent portions of the adhesive layer from diffusing into the first phase-changeable material layer. As such, the second phase-changeable material layer may include a higher atomic percentage of the conductive material than the first phase-changeable material layer.

In other embodiments, a grain size of the second phase-changeable material layer may be smaller than a grain size of the first phase-changeable material layer.

In some embodiments, the second phase-changeable material layer may have a lower thermal conductivity than the first phase-changeable material layer.

In other embodiments, the second phase-changeable material layer may be $(Ge_aSb_bTe_{100-(a+b)})_nN_{100-n}$, where $80 \leq n \leq 95$, where a,b and $100-(a+b)$ may be atomic percentages with respect to the Ge—Sb—Te composition, and where n and $100-n$ may be atomic percentages with respect to the total composition of the second phase-changeable material layer.

According to further embodiments of the present invention, a method of forming a phase-changeable memory device includes forming a first electrode, forming a first phase-changeable material layer on the first electrode, forming a second phase-changeable material layer on the first phase-changeable material layer to define a phase-changeable material pattern, and forming a second electrode on the second phase-changeable material layer such that the first and second electrodes are electrically connected to the phase-changeable material pattern and are configured to provide an electrical signal to the phase-changeable material pattern. The first phase-changeable layer includes nitrogen at a first concentration, and the second phase-changeable layer includes nitrogen at a second concentration, where the second concentration of nitrogen is greater than the first concentration.

In some embodiments, forming the first and/or second phase-changeable material layers may include sputtering a phase-changeable material onto a substrate using an argon sputtering gas and a nitrogen source gas to form the first and/or second phase-changeable material layers on the substrate. For example, the nitrogen source gas may be supplied to the substrate at a first flow rate to deposit the first phase-changeable material layer thereon. In addition, the nitrogen source gas may be supplied to the substrate at a second flow rate greater than the first flow rate to deposit the second phase-changeable material layer on the first phase-changeable material layer. In some embodiments, the second flow rate may be about ten times greater than the first flow rate.

According to still other embodiments of the present invention, a phase-changeable memory device may include a first chalcogenide compound configured to switch between a first resistance state and a second resistance state and doped with nitrogen at a first concentration, and a second chalcogenide compound formed on the first chalcogenide compound and doped with nitrogen at a second concentration. The second concentration can be adjusted to control the diffusion of a material to the first chalcogenide compound. The second concentration may be higher than the first concentration.

In some embodiments, the first chalcogenide compound may be doped with 0-5 at % nitrogen and the second chalcogenide compound may be doped with 5-20 at % nitrogen.

In other embodiments, the phase-changeable memory device may further include an adhesive layer on the second chalcogenide compound, a first electrode on the first chalcogenide compound, and a second electrode on the adhesive layer. The second chalcogenide compound may be between the adhesive layer and the first chalcogenide compound, the adhesive layer may be between the second chalcogenide compound and the second electrode, and the first chalcogenide compound may be between the first electrode and the second chalcogenide compound.

In some embodiments, a grain size of the first chalcogenide compound may be larger than a grain size of the second chalcogenide compound.

According to still further embodiments of the present invention, the phase-changeable memory device may include a first electrode and a second electrode, a phase-changeable memory element between the first electrode and the second electrode, and an adhesion layer between the phase-changeable memory element and the second electrode. The phase-changeable memory element may include a first phase-changeable layer and a second phase-changeable layer. The first phase-changeable layer can be switched between a first resistance state and a second resistance state in response to an electrical signal provided by the first and second electrodes. The second phase-changeable layer may be doped with a greater amount of nitrogen than the first phase-changeable layer. The second phase-changeable layer may not be subjected to phase change in response to the electrical signal provided by the first and second electrodes.

In some embodiments, the concentration of nitrogen can be adjusted such that the first phase-changeable layer may be subject to a phase-change but the second phase-changeable layer may not be subject to a phase change.

According to yet other embodiments of the present invention, a method for forming a phase-changeable memory device may include forming a first phase-changeable layer doped with nitrogen at a first concentration, and forming a second phase-changeable layer doped with nitrogen at a second concentration higher than the first concentration.

In some embodiments, the first phase-changeable layer and the second phase-changeable layer may be formed by a sputtering process where a chalcogenide compound is used as a target, an argon gas is used as a sputtering gas, and a nitrogen gas is used as a nitrogen source.

In other embodiments, the method may further include forming a first electrode contacting the first phase-changeable layer, forming an adhesive layer contacting the second phase-changeable layer, and forming a second electrode contacting the adhesive layer.

DETAILED DESCRIPTION OF EMBODIMENTS OF THE INVENTION

Figure 1:
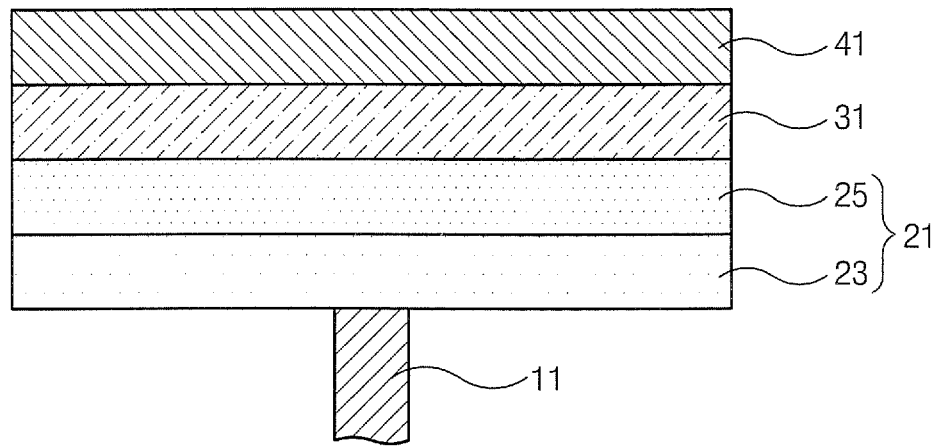
FIG. 1 is a cross-sectional view of a phase-changeable memory device according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

It will also be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross-sectional view of a phase-changeable memory device according to some embodiments of the present invention. Referring to FIG. 1, a phase-changeable memory device 1 includes a phase-changeable layer 21 that is interposed between a first electrode 11 and a second electrode 41. The phase-changeable layer 21 includes a first phase-changeable layer 23 and a second phase-changeable layer 25, and serves as a memory element. The first phase-changeable layer 23 is different from the second phase-changeable layer 25 in chemical, electrical, and/or physical characteristics. For example, the first phase-changeable layer 23 and the second phase-changeable layer 25 may be different in grain size, resistivity, chemical composition, nitrogen (N) concentration, and/or thermal conductivity (Tc). For instance, the second phase-changeable layer 25 may include a higher concentration of nitrogen than the first phase-changeable layer 23. In some embodiments, the second phase-changeable layer 25 may be doped with nitrogen, while the first phase-changeable layer 23 may not be doped with nitrogen. In other embodiments, the second phase-changeable layer 25 may contain conductive materials such as titanium (Ti), zirconium (Zr), tungsten (W), molybdenum (Mo), tantalum (Ta), copper (Cu), aluminum (Al), titanium tungsten (TiW), and/or combinations thereof, while the first phase-changeable layer 23 may not contain such elements. In still other embodiments, the second phase-changeable layer 25 may contain more Ti and/or Zr than the first phase-changeable layer 23. In still other embodiments, the second phase-changeable layer 205 may have a larger grain size than the first phase-changeable layer 23.

An adhesive layer 31 is interposed between the second phase-changeable layer 25 and the second electrode 41. For example, the adhesive layer 31 may comprise Ti, Zr, W, Mo, Ta, Cu, Al, TiW, and/or combinations thereof.

The first electrode 11 and the second electrode 41 may be formed of one or more conductive materials that can deliver an electrical signal to the phase-changeable layer 21. For example, the first electrode 11 may be formed of titanium nitride (TiN), tantalum nitride (TaN), molybdenum nitride (MoN), niobium nitride (NbN), titanium silicon nitride (TiSiN), titanium aluminum nitride, (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxygen nitride (TiON), titanium aluminum oxygen nitride (TiAlON), tungsten oxygen nitride (WON), tantalum oxygen nitride (TaON), carbon-containing conductive material, titanium, tungsten, molybdenum, tantalum, titanium silicide, tantalum silicide, and/or combinations thereof.

The second electrode 41, for example, may be formed of TiN, Al, Al—Cu alloy, Al—Cu—Si alloy, tungsten silicide (WSi), W, Mo, Ta, TiW, Cu, and/or combinations thereof.

In some embodiments, the phase-changeable layer 21 may be formed of a chalcogenide compound. Examples of the chalcogenide compound may include Ge—Sb—Te, As—Sb—Te, As—Ge—Sb—Te, Sn—Sb—Te, In—Sn—Sb—Te, Ag—In—Sb—Te, Group 5A element-Sb—Te, Group 6A element-Sb—Te, Group 5A element-Sb—Se, and/or Group 6A element-Sb—Se.

Figure 2:
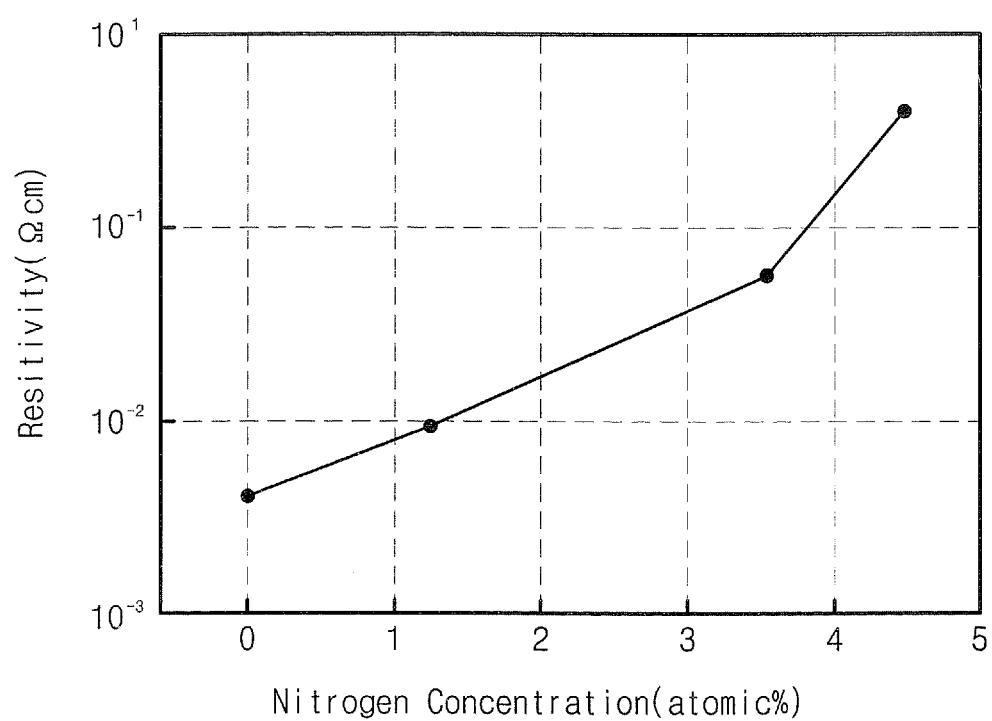
FIG. 2 is a graph illustrating the resistivity of a GST layer depending on nitrogen doping concentration according to some embodiments of the present invention.

In some embodiments of the present invention, the second phase-changeable layer 25 may include a larger amount of nitrogen than the first phase-changeable layer 23. For example, the first phase-changeable layer 23 may include about 0-5 atomic percent (at %) of nitrogen, while the second phase-changeable layer 25 may include about 5-10 at % of nitrogen. As can be seen from FIG. 2, the resistivity of the phase-changeable layer increases as the nitrogen concentration increases. In FIG. 2, a germanium-antimony-tellurium (GST) layer is used as the phase-changeable layer, the x-axis represents the at % of nitrogen contained in the GST layer, and the y-axis represents the resistivity in ohm-centimeters ($\Omega$cm) of the GST layer.

The amount of nitrogen included in the phase-changeable layer affects the crystalline structure of the phase-changeable layer. A hexagonal close-packed lattice (HCP) may be dominant when the phase-changeable layer does not include nitrogen, while a face-centered cubic arrangement (FCC) may be dominant when the phase-changeable layer includes nitrogen. In other words, as the concentration of nitrogen increases, the structure of the crystalline state of the phase-changeable layer changes from HCP to FCC. The free energy change ($\Delta G_{doped}$) between the crystalline and amorphous states of the phase-changeable layer including nitrogen is smaller than the free energy change ($\Delta G_{undoped}$) between the crystalline and amorphous states of the phase-changeable layer that does not include nitrogen. Accordingly, when the phase-changeable layer includes nitrogen, the program current (particularly, the reset current) of the phase-changeable memory device decreases.

In addition, the phase-changeable layer including nitrogen has a much smaller grain size than the phase-changeable layer that does not include nitrogen. Accordingly, when formed with nitrogen as in some embodiments of the present invention, the phase-changeable layer increases in resistance, which may reduce the reset current of the phase-changeable memory device 1.

In some embodiments of the present invention, when energy such as heat, light, voltage and/or current is applied to the phase-changeable layer 21 through the first electrode 11 and the second electrode 41, a phase change between a set state and a reset state occurs at a portion of the first phase-changeable layer 23 contacting the first electrode 11. However, the phase change may not occur at the second phase-changeable layer 25. The concentration of nitrogen can be adjusted such that the phase change occurs at the first phase-changeable layer 23 but does not occur at the second phase-changeable layer 25. As shown in FIG. 1, the first electrode 11 may have the shape of a contact plug, and thus the applied current may be concentrated on a portion of the first phase-changeable layer 23 contacting the first electrode 11. Accordingly, at least the portion of the first phase-changeable layer 23 contacting the first electrode 11 increases in temperature and thus undergoes a phase change.

Because a phase change occurs at the first phase-changeable layer 23, the second phase-changeable layer 25 may have different chemical, electrical and/or physical characteristics from the first phase-changeable layer 23. The Ti and/or Zr of the adhesive layer 31 may diffuse and/or otherwise infiltrate into the first phase-changeable layer 23, which may increase a leakage current and/or the reset current of the phase-changeable memory device. In some embodiments of the present invention, the second phase-changeable layer 25 may reduce and/or prevent Ti and/or Zr of the adhesive layer 31 from diffusing and/or otherwise infiltrating into the first phase-changeable layer 23 where the phase-change occurs. As described above, the second phase-changeable layer 25 is higher than the first phase-changeable layer 23 in terms of nitrogen concentration. However, as the nitrogen concentration increases, the grain size of the phase-changeable layer decreases. Therefore, the first phase-changeable layer 23 has a larger grain size than the second phase-changeable layer 25. Accordingly, the second phase-changeable layer 25 may have a smaller grain size, and thus may function as a protective layer that is configured to restrain the material (e.g., Ti, Zr, W, Mo, Ta, Cu, Al, or TiW) of the adhesive layer 31 from diffusing into the first phase-changeable layer 23. For example, some and/or most of the material diffusing from the adhesive layer 31 may reach the second phase-changeable layer 25, but may not reach the first phase-changeable layer 23.

Also, the second phase-changeable layer 25 may be formed to reduce and/or prevent heat applied to the first phase-changeable layer 23 from being transmitted. That is, the second phase-changeable layer 25 may be formed to have a relatively low thermal conductivity (Tc). In some embodiments, the second phase-changeable layer 25 may be formed to have a lower Tc than the first phase-changeable layer 23. Accordingly, the second phase-changeable layer 25 may be formed to have an excellent thermal insulation effect, which may thereby enhance the program efficiency for the first phase-changeable layer 23.

In addition, some of the conductive elements included in the adhesive layer 31 may diffuse into the second phase-changeable layer 25. Therefore, the second phase-changeable layer 25 may include conductive elements such as Ti, Zr, W, Mo, Ta, Cu, Al, or TiW. Accordingly, the second phase-changeable layer 25 may have a reduced resistance, and thus can be used to form an ohmic contact with the first phase-changeable layer 23.

According to some embodiments of the present invention, the second phase-changeable layer 25 reduces and/or prevents the elements of the adhesive layer 31 from diffusing into the first phase-changeable layer 23. Accordingly, the adhesive layer 31 can be formed relatively thick, thereby providing a relatively strong adhesive force between the phase-changeable layer 21 and the second electrode 41.

Figure 3:
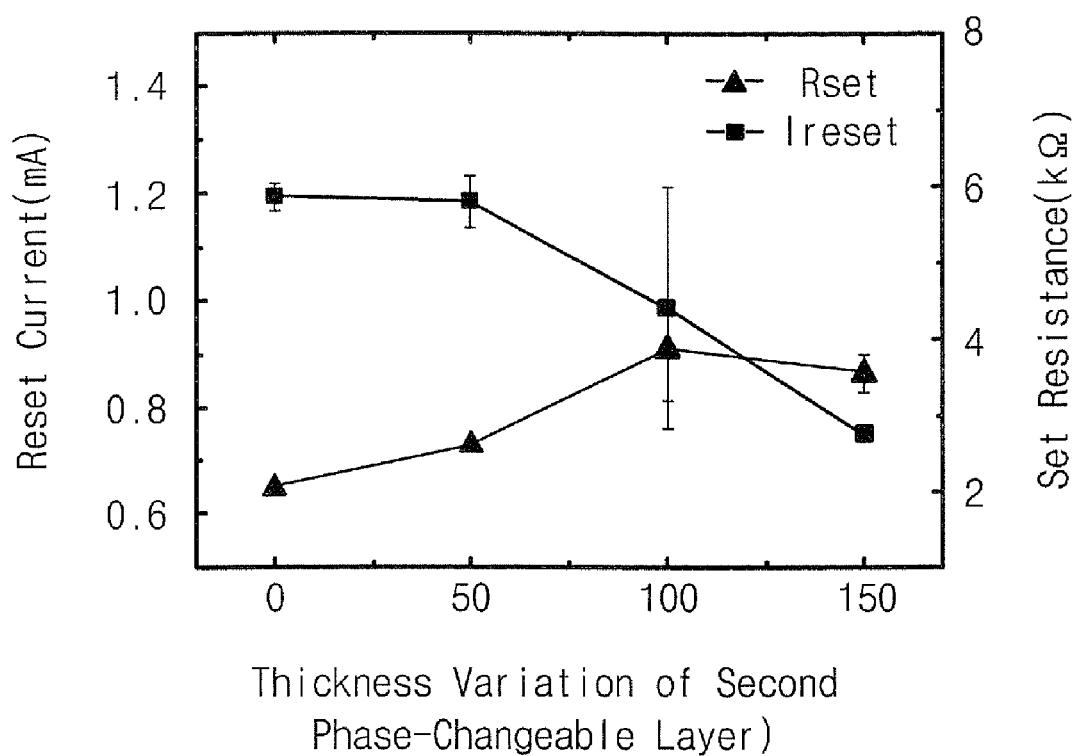
FIG. 3 is a graph illustrating the reset current and the set resistance of a phase-changeable layer depending on the thickness of a second phase-changeable layer in the phase-changeable memory device of FIG. 1.

FIG. 3 is a graph illustrating the relationship between the thickness of the second phase-changeable layer 25 and the reset current/set resistance of the phase-changeable layer 21, according to some embodiments of the present invention. As shown in FIG. 3, the thickness of the second phase-changeable layer 25 is changed while the overall thickness of the phase-changeable layer 21 is maintained at about 1000 Å. In addition, the first phase-changeable layer 23 is doped to a nitrogen concentration of about 0.75 at %, while the second phase-changeable layer 25 is doped to a nitrogen concentration of about 6.5 at %. In FIG. 3, the x-axis represents the thickness in Angstroms (Å) of the second phase-changeable layer 25, the left side y-axis represents the reset current Ireset in milliamps (mA), and the right side y-axis represents the set resistance Rset in kilo-ohms (k$\Omega$). As can be seen from FIG. 3, the reset current decreases as the thickness of the second phase-changeable layer 25 increases. This may be due to the fact that the material diffusion blocking capability of the second phase-changeable layer 25 may be enhanced as the thickness of the second phase-changeable layer 25 increases.

However, in some embodiments, instead of adjusting the thickness of the second phase-changeable layer 25 as shown in FIG. 3, the nitrogen concentration of the second phase-changeable layer 25 may be adjusted while the thickness of the second phase-changeable layer 25 is maintained. Accordingly, as the nitrogen concentration of the second phase-changeable layer 25 is increased, the material diffusion blocking capability of the second phase-changeable layer 25 may be enhanced to reduce the reset current.

The nitrogen concentration and/or the thickness of the second phase-changeable layer 25 may influence the thickness of the adhesive layer 31 in devices according to some embodiments of the present invention. As described above, the material diffusion blocking capability of the second phase-changeable layer 25 may be enhanced as the nitrogen concentration and/or the thickness of the second phase-changeable layer 25 increases. Therefore, as the nitrogen concentration and/or thickness of the second phase-changeable layer 25 is increased, a thicker adhesive layer 31 may be used, which may increase the adhesive force between the phase-changeable layer 21 and the second electrode 41. If the adhesive layer 31 is relatively thin, the second electrode 41 may be lifted from the phase-changeable layer 21. This lifting phenomenon may occur more frequently in devices having higher degrees of integration. Accordingly, the phase-changeable memory device 1 of embodiments of the present invention may be suitable for achieving a relatively high degree of integration.

The phase-changeable memory device 1 is programmed by application of an electrical signal, for example, a program current, to the first phase-changeable layer 23 through the first and second electrodes 11 and 41. When a relatively high program current is applied to the first phase-changeable layer 23 for a relatively short time and then the first phase-changeable layer 23 is cooled rapidly, at least the portion of the first phase-changeable layer 23 contacting the first electrode 11 becomes an amorphous state, and thus the phase-changeable memory device 1 is changed to a reset state with a relatively high resistance. In contrast, when a relatively low program current is applied to the first phase-changeable layer 23 for a relatively long time and then the first phase-changeable layer 23 is cooled, at least the portion of the first phase-changeable layer 23 contacting the first electrode 11 becomes a crystalline state, and thus the phase-changeable memory device 1 is changed a set state with a relatively low resistance.

Data stored in the phase-changeable memory device 1 may be read by measuring the resistance of the phase-changeable layer 21. For example, an electrical signal (e.g., a read current) may be applied through the first and second electrodes 11 and 41 to the phase-changeable layer 21 (particularly, to the first phase-changeable layer 23), and the resulting voltage (read voltage) across the first phase-changeable layer 23 may be compared with a reference voltage by a comparator, such as a sense amplifier. The read voltage is proportional to the resistance of the first phase-changeable layer 23. That is, a high read voltage and a low read voltage indicate a high-resistance state (i.e., a reset state) and a low-resistance state (i.e., a set state), respectively.

Figure 4:
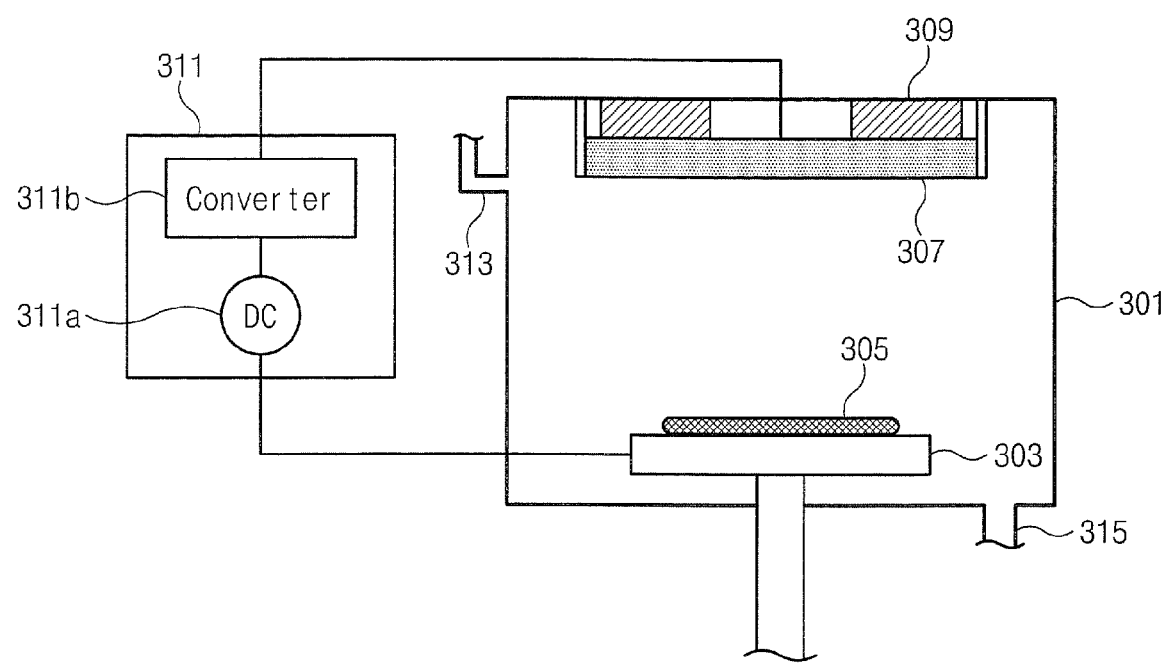
FIG. 4 is a block diagram of an apparatus for forming a phase-changeable layer according to some embodiments of the present invention.

A method for forming the phase-changeable layer 21 according to some embodiments of the present invention will now be described in greater detail with reference to FIG. 4. FIG. 4 is a block diagram illustrating a deposition chamber used in forming the phase-changeable layer 21 according to some embodiments of the present invention. The first phase-changeable layer 23 and the second phase-changeable layer 25 may be deposited in situ using the same deposition chamber, or may be deposited using different deposition chambers.

Referring now to FIG. 4, an apparatus for depositing a chalcogenide compound according to some embodiments of the present invention includes a reaction chamber 301 having a substrate 305 and a chalcogenide compound target 307 that face each other. A direct current (DC) pulse generator is connected between the chalcogenide compound target 307 and the substrate 305 to supply a DC pulse to the chalcogenide compound target 307 and the substrate 305. The substrate 305 is supported by a support 303. A magnet 309 is mounted on a surface of the chalcogenide compound target 307 opposite the substrate 305. Therefore, a higher-density plasma may be formed at a portion of the chalcogenide compound target 307 corresponding to the magnet 309 than at the other portions in the reaction chamber 301. Accordingly, more target elements may be emitted to increase the speed of deposition of a thin film on the substrate 305. The chalcogenide compound target 307 may be formed of Ge—Sb—Te, As—Sb—Te, As—Ge—Sb—Te, Sn—Sb—Te, In—Sn—Sb—Te, Ag—In—Sb—Te, Group 5A element-Sb—Te, Group 6A element-Sb—Te, Group 5A element-Sb—Se, and Group 6A element-Sb—Se.

The wall of the reaction chamber 301 is equipped with a gas supply duct 313 through which an inert gas and a nitrogen gas flow into the reaction chamber 301. In addition, a exhaust duct 315 for exhausting the reaction byproducts in the reaction chamber 301 is connected to the reaction chamber 301. The reaction chamber 301 is maintained at a high-vacuum state by a vacuum pump.

The inflow rate of nitrogen gas supplied through the gas supply duct 313 may be used to control the nitrogen concentration of the first and/or second phase-changeable layers. For example, nitrogen gas may be supplied at a flow rate of about 2 standard centimeter cube per minute (sccm) to form the first phase-changeable layer 23, and nitrogen gas may be supplied at a flow rate of about 25 sccm to form the second phase-changeable layer 25. The inside of the reaction chamber 301 may be maintained at a pressure range of about 0.1-1 mT and at a temperature of about 100-350° C.

The DC pulse generator 311 may supply the chalcogenide compound target 307 and the substrate 305 with a positive DC pulse, a negative DC pulse, and/or a DC pulse that swings between a positive value and a negative value. The DC pulse generator 311 includes a DC bias supply source 311$a$ for generating a DC bias voltage and a pulse converter 311$b$ for converting the generated DC bias voltage into a square-wave pulse voltage. Methods for generating a pulse voltage using a DC bias voltage are well known to those skilled in the art, and thus their description will be omitted for conciseness.

A nitrogen gas and an inert gas such as an argon gas are supplied through the gas supply duct 313 into the reaction chamber 301 at a predetermined flow rate. The argon and nitrogen gases in the reaction chamber 301 are changed into a plasma state by high-voltage pulses that are supplied from the DC pulse generator 311 to the chalcogenide compound target 307 and the substrate 305. Argon ions (Ar+) in a plasma state collide against the surface of the chalcogenide compound target 307 at a high energy, and thus the elements of the chalcogenide compound target 307 are separated from the surface of the chalcogenide compound target 307. The separated elements and nitrogen radicals react with each other, and thus a chalcogenide compound thin film including nitrogen is deposited onto the substrate 305.

In some embodiments, the amount of nitrogen gas flowing into the gas supply duct 313 may be controlled such that the first phase-changeable layer 23 and the second phase-changeable layer 25 can be formed in situ using the same deposition apparatus. For example, nitrogen gas may be supplied at a first flow rate to form the first phase-changeable layer 23 with a desired thickness, and nitrogen gas may be supplied at a second flow rate higher than the first flow rate to form the second phase-changeable layer 25 with a desired thickness.

The phase-changeable layer 21 may be formed by chemical vapor deposition (CVD) and/or atomic layer deposition (ALD).

Referring back to FIG. 1, the first electrode 11 is formed in the shape of a plug that may extend through an insulating layer. The forming of the first electrode 11 may include depositing an insulating layer, forming a contact hole in the deposited insulating layer, depositing a conductive layer for the first electrode 11, and etching the portions of the deposited conductive layer outside of the contact hole. The conductive layer for the first electrode 11 may be deposited by physical vapor deposition (PVD), CVD, sputtering, and/or ALD.

The second electrode 41 may be formed by depositing a conductive layer for the second electrode 41 and then patterning the deposited conductive layer by using a photolithography process. The conductive layer for the second electrode 41 may be deposited by PVD, CVD, sputtering, and/or ALD.

Likewise, the adhesive layer 31 may be formed by a deposition process and a patterning process using a photolithography process.

In some embodiments, the phase-changeable layer 21, the adhesive layer 31, and the second electrode 41 may be formed by a single patterning process. For example, after thin films for the phase-changeable layer 21, the adhesive layer 31, and the second electrode 41 are sequentially formed on an insulating layer on which the first electrode is formed, a photolithography process may be used to pattern the thin films until the insulating layer is exposed, thereby forming the phase-changeable layer 21, the adhesive layer 31, and the second electrode 41.

Figure 5:
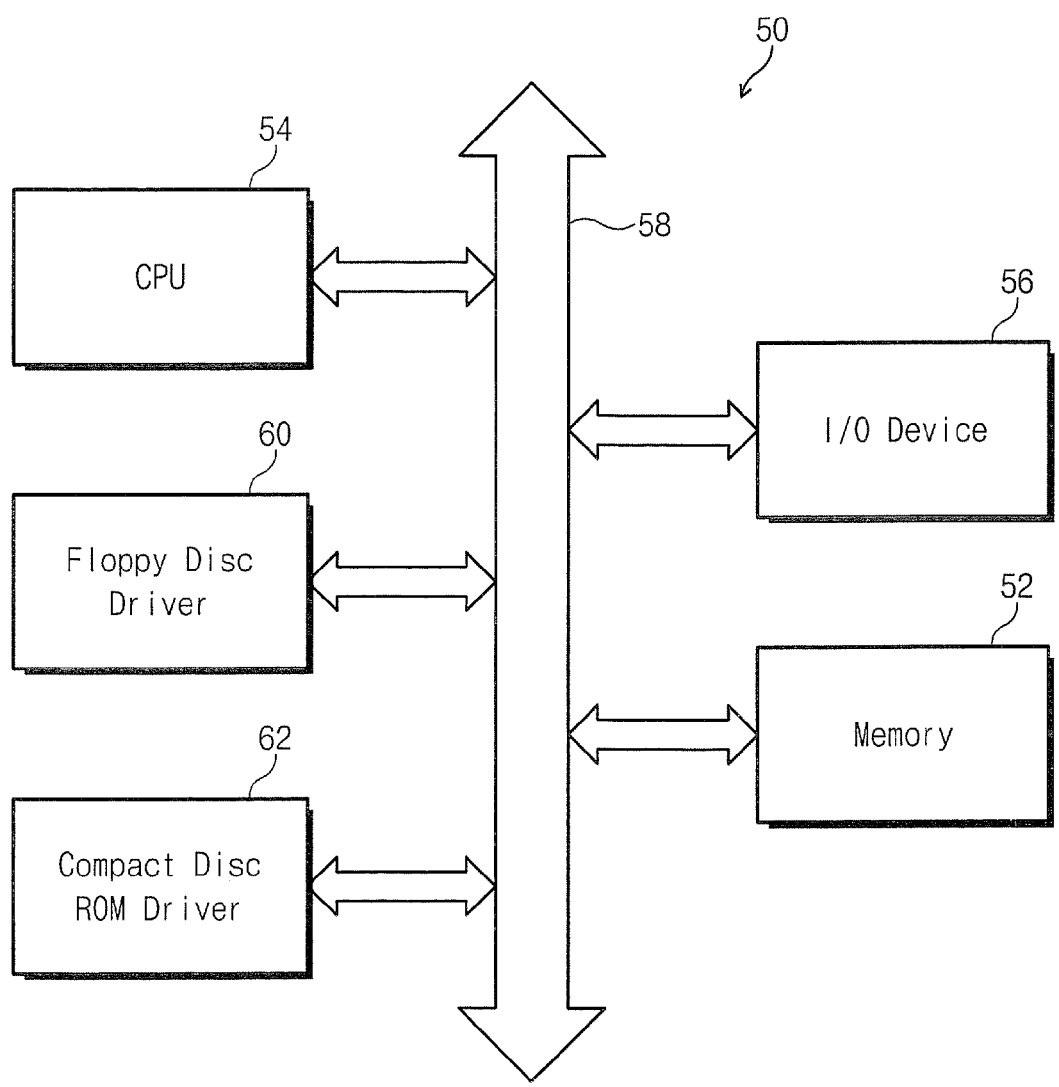
FIG. 5 is a block diagram of a data processing system including a memory unit using a phase-changeable memory device according to some embodiments of the present invention.

FIG. 5 is a block diagram of a data processing system 50 including a memory 52 using phase-changeable memory devices according to some embodiments of the present invention. Referring to FIG. 5, the data processing system 50 includes a central processing unit (CPU) 54 that communicates with an input/output (I/O) unit 56 via a bus 58. Examples of the CPU 54 may include a microprocessor, a digital signal processor, and/or a programmable digital logic unit. Under the control of a memory controller, the memory 52 communicates with the system via the bus 58. For example, when the data processing system 50 is a computer system, it may include peripheral devices such as a floppy disk drive (FDD) 60 and a CD-ROM drive 62. These peripheral devices communicate with the CPU 54 via the bus 58. The memory 52 may include one or more resistance memory elements. Also, the memory 52 may be combined with the CPU 54 to form a single integrated circuit (IC).

In addition, the data processing system 50 can be used in portable data assistants (PDAs) capable of supporting personal wireless communication services, portable computers, portable phones, digital music players, digital cameras, and/or other wireless devices that are configured to wirelessly transmit and/or receive data.

Figure 6:
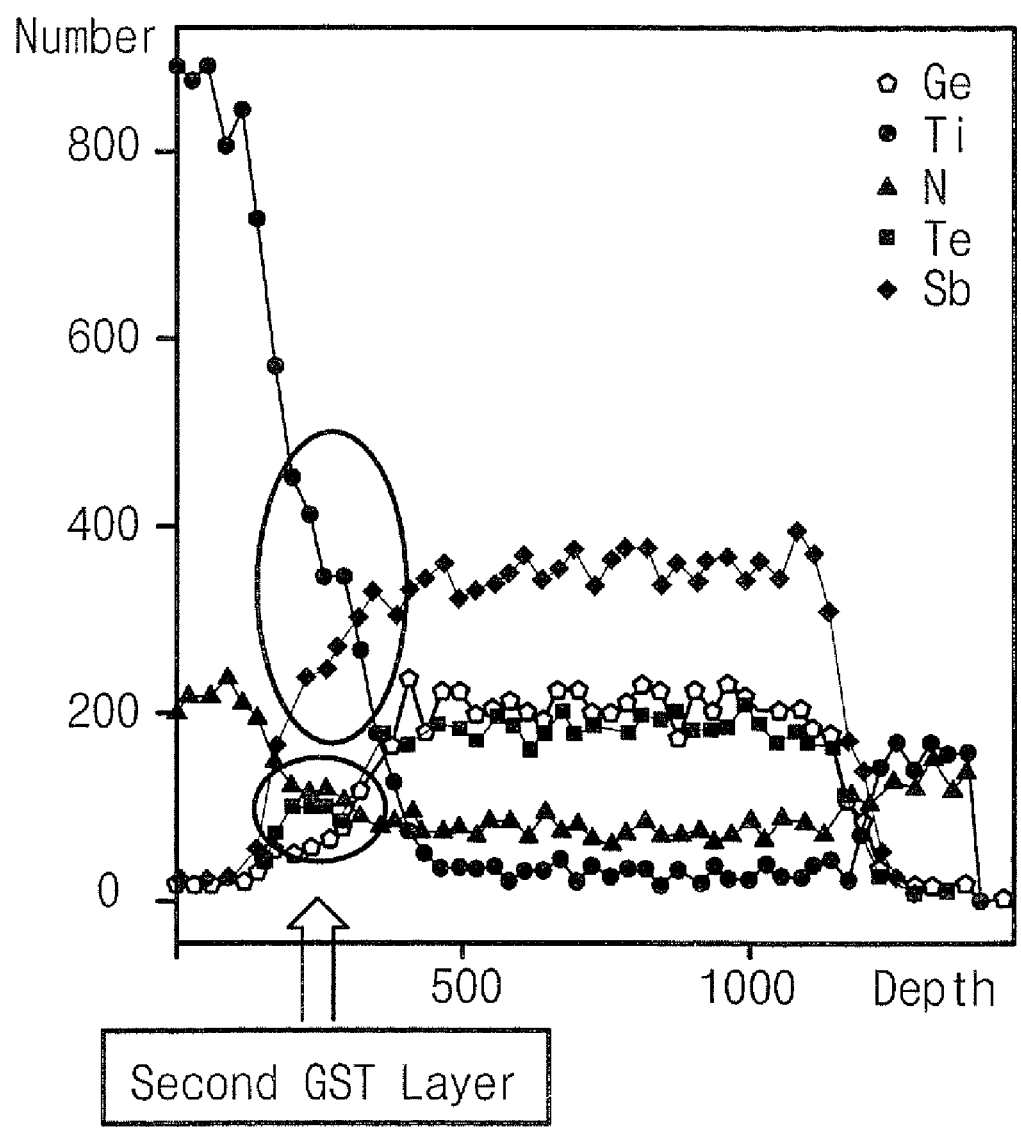
FIG. 6 is a graph illustrating the titanium concentration profile of a phase-changeable memory device according to some embodiments of the present invention.

Further embodiments of the present invention will now be described with reference to the graph of FIG. 6. In FIG. 6, a first electrode of TiAlN, a first GST layer containing about 3-at % nitrogen, a second GST layer containing about 10-at % nitrogen, a Ti adhesive layer, and a second electrode of TiN are sequentially deposited on a substrate, and the element concentrations of the deposited layers (with reference to depths from a surface of the adhesive layer) are illustrated.

As shown in FIG. 6, the second GST layer has a greater nitrogen concentration than the first GST layer, and thus includes smaller amounts of Ge, Sb and Te than the first GST layer. As can be seen from FIG. 6, the amount of the Ge, Sb and Te is maintained to be substantially constant over a depth range of about 500-1000 Å, but decreases as the depth decreases below about 500 Å. The portion where the amount is substantially constant corresponds to the first GST layer, and the portion where the amount decreases corresponds to the second GST layer.

As can be seen from FIG. 6, the titanium concentration gradually decreases from the Ti adhesive layer toward the second GST layer, and rapidly decreases from the second GST layer toward the top of the first GST layer. Consequently, the first GST layer has very little titanium concentration. This illustrations that a major portion of the titanium is absorbed at the second GST layer contacting the Ti adhesive layer and thus relatively little to no titanium is diffused into the first GST layer. Therefore, the second GST layer substantially reduces and/or prevents titanium from the adhesive layer from diffusing into the first GST layer.

As described above, some embodiments of the present invention may make it possible to reduce the program current of a phase-changeable memory device. Also, it may be possible to implement phase-changeable memory devices that have relatively high reliability and/or integration level. Also, it may be possible to enhance the adhesive force between the phase-changeable layer and the second electrode in phase-changeable memory devices according to some embodiments of the present invention.

While the present invention has been particularly shown and described with reference to preferred embodiments thereof, it will be understood by those skilled in the art that various changes in form and details may be made therein without departing from the spirit and scope of the invention as defined by the appended claims.

That which is claimed:

1. A phase-changeable memory device, comprising:
    a phase-changeable material pattern comprising a first phase-changeable material layer including nitrogen at a first concentration, and a second phase-changeable material layer including nitrogen at a second concentration that is greater than the first concentration; and
    first and second electrodes electrically connected to the phase-changeable material pattern and providing an electrical signal thereto.

2. The device of claim 1, wherein the second concentration of nitrogen comprises from about 5 to about 20 atomic percent of the second phase-changeable material layer.

3. The device of claim 2, wherein the first concentration of nitrogen comprises from about 0 to about 5 atomic percent of the first phase-changeable material layer.

4. The device of claim 1, wherein the first and second concentrations of nitrogen are selected such that a phase change is induced in the first phase-changeable material layer but not in the second phase-changeable material layer when a predetermined current is applied to the phase-changeable material pattern via the first and second electrodes.

5. The device of claim 4, wherein the first electrode is directly on a portion of the first phase-changeable material layer, wherein the second electrode is on the second phase-changeable material layer, and wherein the phase change is induced in at least the portion of the first phase-changeable layer when the predetermined current is applied.

6. The device of claim 5, wherein the first electrode comprises a plug-shaped electrode configured to concentrate the predetermined current on the portion of the first phase-changeable material layer.

7. The device of claim 1, wherein the second phase-changeable material layer further includes a conductive material.

8. The device of claim 7, wherein the conductive material comprises titanium (Ti), zirconium (Zr), tungsten (W), molybdenum (Mo), tantalum (Ta), copper (Cu), aluminum (Al), and/or titanium tungsten (TiW).

9. The device of claim 7, wherein the second phase-changeable material layer includes a higher atomic percentage of the conductive material than the first phase-changeable material layer.

10. The device of claim 7, wherein the first electrode is on the first phase-changeable material layer, wherein the second electrode is on the second phase-changeable material layer, and further comprising:
    an adhesive layer comprising the conductive material between the second electrode and the second phase-changeable material layer.

11. The device of claim 10, wherein the first phase-changeable material layer is directly on the second phase-changeable material layer opposite the adhesive layer, and wherein the second phase-changeable material layer is configured to substantially prevent portions of the adhesive layer from diffusing into the first phase-changeable material layer.

12. The device of claim 1, wherein a grain size of the second phase-changeable material layer is smaller than a grain size of the first phase-changeable material layer.

13. The device of claim 1, wherein the second phase-changeable material layer has a lower thermal conductivity than the first phase-changeable material layer.

14. The device of claim 1, wherein the first and/or second phase-changeable material layers comprise a chalcogenide compound.

15. The device of claim 14, wherein the first and/or second phase-changeable material layers comprise Ge—Sb—Te, As—Sb—Te, As—Ge—Sb—Te, Sn—Sb—Te, In—Sn—Sb—Te, Ag—In—Sb—Te, 5A group element-Sb—Te, 6A group element-Sb—Te, 5A group element-Sb—Se, and/or 6A group element-Sb—Se.

16. The device of claim 14, wherein the second phase-changeable material layer comprises $(Ge_a Sb_b Te_{100-(a+b)})_n N_{100-n}$, wherein $80 \leq n \leq 95$, wherein a,b and 100−(a+b) are atomic percentages with respect to the Ge—Sb—Te composition, and wherein n and 100−n are atomic percentages with respect to the total composition of the second phase-changeable material layer.

17. A phase-changeable memory device, comprising:
a phase-changeable material pattern comprising a first phase-changeable material layer and a second phase-changeable material layer on the first phase changeable material pattern, wherein the first and second phase-changeable material layers have different chemical, physical, and/or electrical characteristics; and
first and second electrodes electrically connected to the phase-changeable material pattern and providing an electrical signal thereto.

18. The device of claim 17, wherein the second phase-changeable material layer has a greater resistivity than the first phase-changeable material layer.

19. The device of claim 17, wherein the second phase-changeable material layer comprises a greater nitrogen concentration than the first phase-changeable material layer.

20. The device of claim 19, wherein the nitrogen concentration of the first phase-changeable material layer comprises from about 0 to about 5 atomic percent, and wherein the nitrogen concentration of the second phase-changeable material layer comprises from about 5 to about 20 atomic percent.

21. The device of claim 17, wherein the second phase-changeable material layer further includes a conductive material.

22. The device of claim 21, wherein the conductive material comprises titanium (Ti), zirconium (Zr), tungsten (W), molybdenum (Mo), tantalum (Ta), copper (Cu), aluminum (Al), and/or titanium tungsten (TiW).

23. The device of claim 17, wherein a grain size of the second phase-changeable material layer is smaller than a grain size of the first phase-changeable material layer.

24. The device of claim 17, wherein the second phase-changeable material layer has a lower thermal conductivity than the first phase-changeable material layer.

* * * * *